(12) United States Patent
Matsumoto

(10) Patent No.: US 10,148,027 B2
(45) Date of Patent: Dec. 4, 2018

(54) STRUCTURE FOR CONNECTING BOARD AND CONNECTOR, BOARD, AND METHOD FOR CONNECTING BOARD AND CONNECTOR

(71) Applicant: Hirose Electric Co., Ltd., Shinagawa-ku, Tokyo (JP)

(72) Inventor: Teppei Matsumoto, Tokyo (JP)

(73) Assignee: HIROSE ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/812,765

(22) Filed: Nov. 14, 2017

(65) Prior Publication Data

US 2018/0138615 A1 May 17, 2018

(30) Foreign Application Priority Data

Nov. 14, 2016 (JP) ................. 2016-221196

(51) Int. Cl.
| | |
|---|---|
| H01R 12/00 | (2006.01) |
| H01R 12/72 | (2011.01) |
| H01P 5/08 | (2006.01) |
| H01R 12/70 | (2011.01) |
| H01R 12/75 | (2011.01) |
| H01R 13/646 | (2011.01) |
| H05K 1/02 | (2006.01) |
| H05K 1/18 | (2006.01) |
| H05K 3/18 | (2006.01) |

(Continued)

(52) U.S. Cl.
CPC ........... *H01R 12/722* (2013.01); *H01P 5/085* (2013.01); *H01R 9/0515* (2013.01); *H01R 12/7047* (2013.01); *H01R 12/75* (2013.01); *H01R 13/646* (2013.01); *H05K 1/0242* (2013.01); *H05K 1/0253* (2013.01); *H05K 1/18* (2013.01); *H05K 3/18* (2013.01); *H05K 3/301* (2013.01); *H05K 1/181* (2013.01); *H05K 2201/093* (2013.01); *H05K 2201/0919* (2013.01); *H05K 2201/10189* (2013.01); *H05K 2201/10409* (2013.01)

(58) Field of Classification Search
CPC ............................... H01R 24/46; H01R 24/50
USPC ................................... 439/63, 581
See application file for complete search history.

(56) References Cited

U.S. PATENT DOCUMENTS 9,271,391 B2 * 2/2016 Okayama ............. H05K 1/0237
9,433,083 B2 * 8/2016 Moncayo ............... H05K 1/115

FOREIGN PATENT DOCUMENTS

JP 2014-007390 A 1/2014

* cited by examiner

*Primary Examiner* — Phuong Dinh
(74) *Attorney, Agent, or Firm* — Procopio, Cory, Hargreaves & Savitch LLP

(57) ABSTRACT

A structure that includes a board and a connector secured to an end portion of the board. The board has a first dielectric layer, a signal pattern that is provided on the top face of the first dielectric layer, a first ground layer that is provided under the first dielectric layer and forms part of a signal transmission circuit in conjunction with the signal pattern, and a plating film formed on an end face of the end portion of the board in an area located directly under the signal pattern and includes an end face of the first ground layer. The connector has a center conductor, an outer conductor, and securing portions that secure the connector to an end portion of the board. When the connector is secured, the center conductor comes in contact with the signal pattern and the plating film comes in contact with the outer conductor.

10 Claims, 10 Drawing Sheets

(51) Int. Cl.
*H05K 3/30* (2006.01)
*H01R 9/05* (2006.01)

STRUCTURE FOR CONNECTING BOARD AND CONNECTOR, BOARD, AND METHOD FOR CONNECTING BOARD AND CONNECTOR

CROSS REFERENCE TO RELATED APPLICATIONS

This Paris Convention Patent Application claims benefit under 35 U.S.C. § 119 and claims priority to Japanese Patent Application No. JP 2016-221169, filed on Nov. 14, 2016, titled "STRUCTURE FOR CONNECTING BOARD AND CONNECTOR, BOARD, AND METHOD FOR CONNECTING BOARD AND CONNECTOR", the content of which is incorporated herein in its entirety by reference for all purposes.

BACKGROUND

Technical Field

The present invention relates generally to a structure for connecting a board used for radio-frequency signal transmission circuits and a connector, to a board, and to a method for connecting a board and a connector.

Background Art

When a circuit for transmitting radio-frequency signals is formed by connecting a board and a connector, the characteristics of signal reflection between the board and the connector need to be enhanced.

Patent Document 1, which is shown below, describes a multilayer wiring board (hereinafter referred to as "conventional multilayer wiring board") that can be used for radio-frequency signal transmission circuitry. The conventional multilayer wiring board includes a multilayer wiring board and a connector mounted to the multilayer wiring board. The connector is a coaxial connector that has a center conductor and an outer conductor, while the multilayer wiring board is a multilayer board made up of three or more layers. Specifically, the multilayer wiring board has a first dielectric layer, with a radio-frequency signal path formed on the top face of the first dielectric layer and a ground layer formed on the bottom face of the first dielectric layer, and, in addition, a plurality of layers formed under the ground layer, including a second dielectric layer, a control signal layer, a third dielectric layer, and so forth. Furthermore, ground electrode portions are provided on the top face of the multilayer wiring board on both sides of the radio-frequency signal path, with the ground electrode portions connected to the ground layer via through-holes.

In addition, in the conventional multilayer wiring board, the center conductor of the connector is joined to the radio-frequency signal path of the multilayer wiring board, thereby electrically connecting the center conductor to the radio-frequency signal path. In addition, the outer conductor of the connector is provided with a pair of protrusions, with these protrusions respectively joined to the ground electrode portions formed on both sides of the radio-frequency signal path. As a result, the outer conductor is electrically connected to the ground electrode portions.

Furthermore, in the conventional multilayer wiring board, the layers formed under the ground layer, in other words, the second dielectric layer, the control signal layer, the third dielectric layer, and so forth, are spaced apart from the edge of the first dielectric layer, thereby partially exposing the bottom face of the ground layer formed on the bottom face of the first dielectric layer. The exposed portion of the ground layer (exposed ground portion) is then joined to the outer conductor of the connector by soldering and the like, thereby electrically connecting the ground layer to the outer conductor.

Although the electrical connection of the ground layer to the outer conductor in the conventional multilayer wiring board is accomplished by joining the ground electrode portions to the protrusions, this is also additionally accomplished by joining the exposed ground portion to the outer conductor. According to the Specification of Patent Document 1, establishing a direct connection between the ground layer and the outer conductor by joining the exposed ground portion to the outer conductor suppresses an increase in the ground inductance of the multilayer wiring board and the connector and ensures the waveform quality of high-speed data signals.

PRIOR ART DOCUMENTS

Patent Documents

[Patent Document 1]
Japanese Patent Application Publication No. 2014-7390.

SUMMARY

Problems to be Solved by the Invention

It is believed that, since the above-described conventional multilayer wiring board is configured such that the ground layer is directly connected to the outer conductor by joining the exposed ground portion to the outer conductor, the characteristics of signal reflection between the multilayer wiring board and the connector can be enhanced relative to the case in which no such configuration is used.

However, as described in Patent Document 1, in the conventional multilayer wiring board, the exposed ground portion and the outer conductor are joined together using solder, silver paste, or an electroconductive adhesive. For this reason, when the board and the connector are connected, the operations of soldering, silver paste application, or coating with an electroconductive adhesive need to be performed in order to join the exposed ground portion to the outer conductor. In addition, when the connector is separated from the board, it is necessary to perform the operation of removing the solder, silver paste, or electroconductive adhesive in order to debond the exposed ground portion from the outer conductor. Thus, the problem with conventional multilayer wiring boards is that the connection and separation of the connector to and from the multilayer wiring board is a laborious task.

The present invention was made by considering problems such as the ones described above and it is an object of the invention to provide a structure for connecting a board and a connector, a board, and a method for connecting a board and a connector that can enhance the characteristics of signal reflection between the connector and the board and also allow for the connection and separation of the connector to and from the board to be accomplished in a simple manner.

Means for Solving the Problem

There is a need to make it possible to connect and separate a connector to and from a board in a simple manner while enhancing the characteristics of signal reflection between the connector and the board. In order to eliminate the foregoing problems, the inventive structure for connecting a board and a connector includes a board and a connector secured to an end portion of the board; the board has a dielectric layer, a signal pattern that is provided on the top face of the dielectric layer, a first ground layer that is provided under the dielectric layer and forms part of a signal transmission circuit in conjunction with the signal pattern, and an electroconductive end-face film formed on an end face of the end portion of the board in an area that is located directly under the signal pattern, as seen from a position opposite to said end face, and that is remote from the signal pattern and includes an end face of the first ground layer; the connector has a center conductor, an outer conductor provided on the exterior periphery of the center conductor, with an insulator interposed therebetween, and securing portions that are provided on the outer conductor and secure said connector to the end portion of the board; and, when the connector is secured to the end portion of the board by the securing portions, the center conductor comes in contact with the signal pattern and the electroconductive end-face film comes in contact with the outer conductor.

In accordance with the inventive structure for connecting a board and a connector, the first ground layer and the outer conductor can be connected directly under the signal pattern by using a configuration in which the electroconductive end-face film is formed on the end face of the end portion of the board in an area that is located directly under the signal pattern and includes the end face of the first ground layer. Accordingly, the characteristics of signal reflection between the board and the connector can be enhanced. In addition, no solder, silver paste, or electroconductive adhesive is required to connect the first ground layer to the outer conductor because the first ground layer and the outer conductor are connected by bringing the electroconductive end-face film into contact with the outer conductor. The connection and separation of the connector to and from the board can therefore be accomplished in a simple manner because the operations of soldering and the like are no longer required when the board and connector are connected, and, similarly, the operations of unsoldering and the like are no longer required when the connector is separated from the board.

In addition, in the inventive structure for connecting a board and a connector, the board is preferably a multilayer board further having one or more layers provided under the first ground layer.

In addition, in the inventive structure for connecting a board and a connector, the board preferably has a second dielectric layer provided under the first ground layer and adjacent said first ground layer, and a second ground layer provided under the second dielectric layer and adjacent said second dielectric layer, and the electroconductive end-face film is preferably formed on the end face of the end portion of the board in an area that is directly under the signal pattern, as seen from a position opposite to said end face, and that extends from the end face of the first ground layer to the end face of the second ground layer.

In addition, in the inventive structure for connecting a board and a connector, the electroconductive end-face film is preferably a plating film formed by partially plating the board.

In addition, in the inventive structure for connecting a board and a connector, on the end portion of the tubular-shaped outer conductor on the side facing the board, a lower end portion located radially below is preferably set back in the axial direction relative to an upper end portion located radially above, a stepped surface connecting the lower end portion and the upper end portion is preferably formed between the lower end portion and the upper end portion, and, when the connector is secured to an end portion of the board by the securing portions, the end face of the end portion of the board preferably faces the end face of the lower end portion and the top face of the end portion of the board preferably faces the stepped surface.

In addition, in the inventive structure for connecting a board and a connector, the securing portions preferably protrude above the top face of the board from the end portion of the outer conductor on the side facing the board, and said securing portions are preferably secured to the top face of the board via fastening members.

In addition, in the inventive structure for connecting a board and a connector, first bore portions that accept the fastening members therethrough in order to secure the securing portions to the top face of the board are preferably formed in said board, second bore portions that accept the fastening members therethrough in order to secure the securing portions to the top face of the board are preferably formed in said securing portions, and the distance to the first bore portions from the end face of the end portion of the board is preferably longer than the distance to the second bore portions from the portion that the end face of the end portion of the board opposes on the end face of the outer conductor.

In order to eliminate the foregoing problems, the inventive board, which is a board that forms part of a signal transmission circuit, has a dielectric layer, a signal pattern that is provided on the top face of the dielectric layer, a ground layer that is provided under the dielectric layer and forms part of the signal transmission circuit in conjunction with the signal pattern, and an electroconductive end-face film formed on an end face of the end portion of said board in an area that is located directly under the signal pattern, as seen from a position opposite to said end face, and that is remote from the signal pattern and includes the end face of the ground layer; and, when an edge mount type connector, which has a center conductor and an outer conductor provided on the exterior periphery of the center conductor, with an insulator interposed therebetween, is secured to the end portion of said board, the center conductor comes in contact with the signal pattern and the electroconductive end-face film comes in contact with the outer conductor. The inventive board makes it possible to implement the above-described inventive structure for connecting a board and a connector.

In order to eliminate the foregoing problems, the inventive method for connecting a board and a connector is a method for connecting a board and a connector that is used to connect a board that has a dielectric layer, a signal pattern that is provided on the top face of the dielectric layer, and a ground layer that is provided under the dielectric layer and forms part of a signal transmission circuit in conjunction with the signal pattern, and a connector that has a center conductor, an outer conductor provided on the exterior periphery of the center conductor, with an insulator interposed therebetween, and securing portions that are provided on the outer conductor and secure said connector to the end portion of the board, wherein an electroconductive end-face film is formed on an end face of the end portion of the board in an area that is located directly under the signal pattern, as seen from a position opposite to said end face, and that is remote from the signal pattern and includes the end face of the ground layer, and the connector is secured to the end portion of the board via the securing portions while bringing the center conductor into contact with the signal pattern and while also bringing the electroconductive end-face film into contact with the outer conductor. The inventive method for connecting a board and a connector makes it possible to implement the above-described inventive structure for connecting a board and a connector.

In addition, in the inventive method for connecting a board and a connector, the formation of the electroconductive end-face film is preferably accomplished by partially plating the board.

Effects of the Invention

The present invention makes it possible to enhance the characteristics of signal reflection between the connector and the board and also allows for the connector to be connected and separated to and from the board in a simple manner.

DETAILED DESCRIPTION

Embodiment 1

Figure 1:
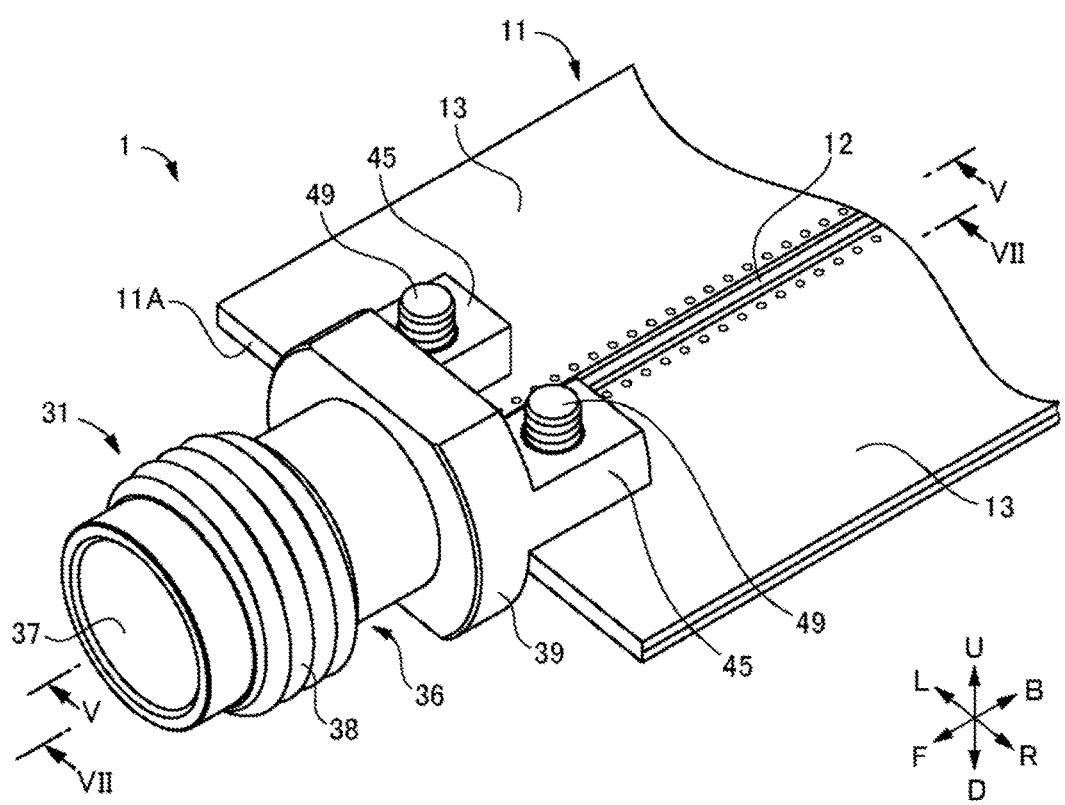
FIG. 1 illustrates an external view illustrating a structure for connecting a board and a connector according to a first embodiment of the present invention.

FIG. 1 illustrates a structure for connecting a board and a connector according to a first embodiment of the present invention. Below, for ease of explanation, the direction of the arrows drawn in the right-hand corner under FIG. 1 and FIG. 2 is referred to, respectively, as "front" for arrow F, "back" or "rear" for arrow B, "left" for arrow L, "right" for arrow R, "up" for arrow U, and "down" for arrow D.

In FIG. 1, the structure for connecting a board and a connector 1 (hereinbelow referred to as the "board-connector connection structure 1") is a structure in which a connector 31 is secured to an end portion of a board 11, thereby respectively electrically connecting a signal pattern 12 on the board 11 to a center conductor 32 (see FIG. 5) in the connector 31, and ground layers 15, 17 (see FIG. 2) in the board 11 to an outer conductor 36 in the connector 31.

Figure 2:
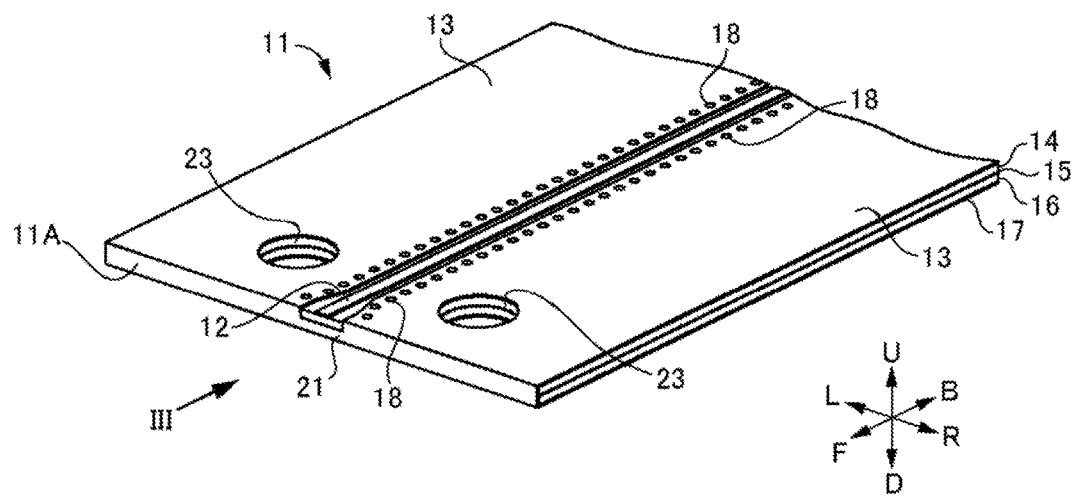
FIG. 2 illustrates an external view illustrating a board used in the structure for connecting a board and a connector according to the first embodiment of the present invention.
Figure 3:
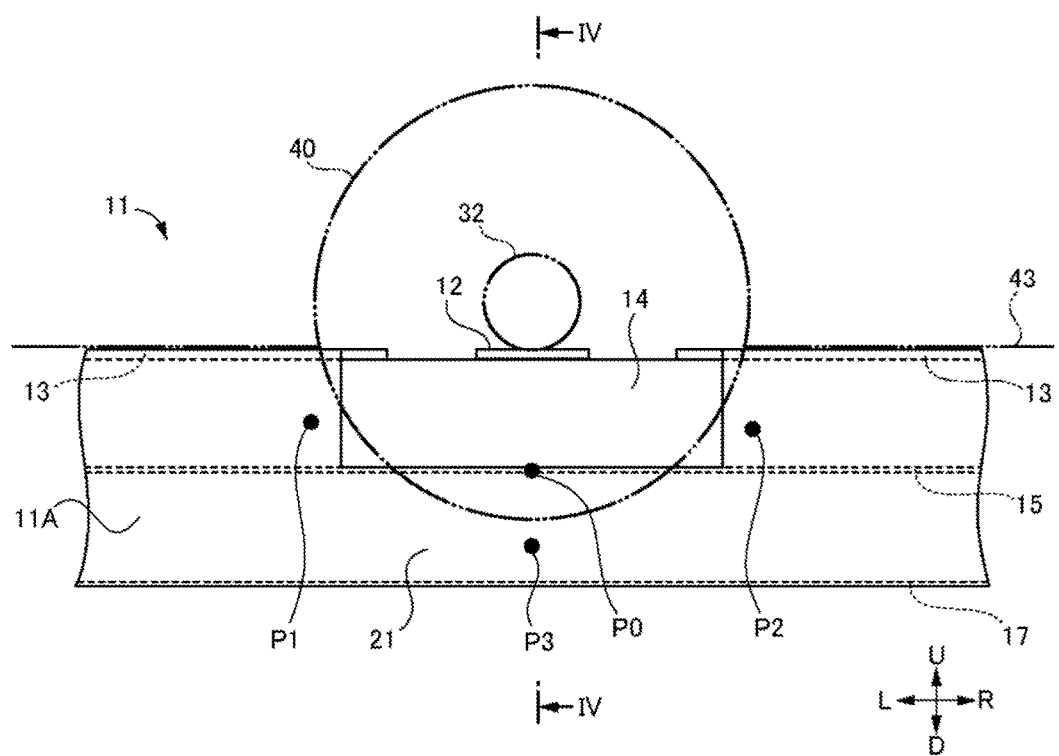
FIG. 3 illustrates an enlarged external view of an end face of an end portion of a board to which a connector is secured in the structure for connecting a board and a connector according to the first embodiment of the present invention.
Figure 4:
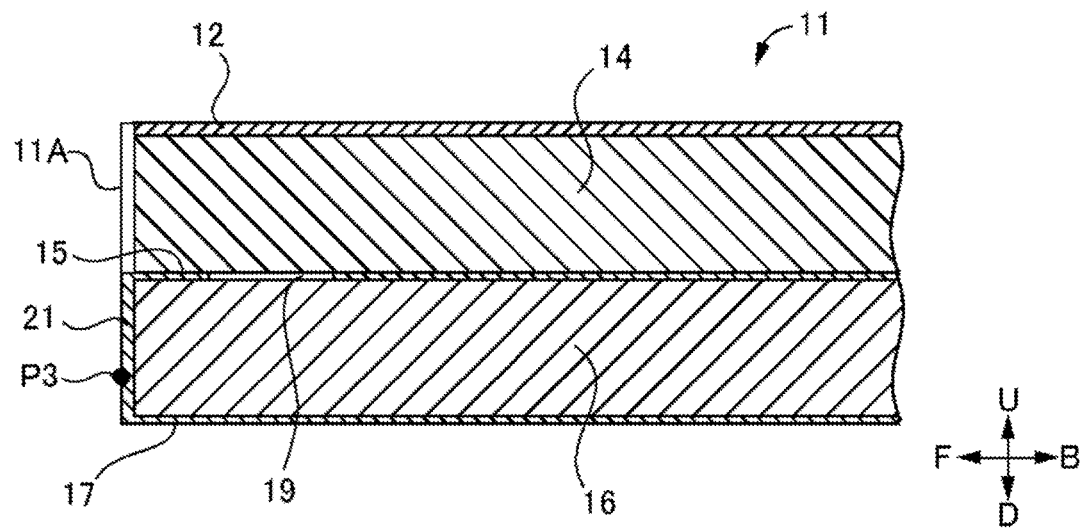
FIG. 4 illustrates a cross-sectional view illustrating the board as seen in the direction of arrows IV-IV in FIG. 3.

FIG. 2 illustrates the board 11. FIG. 3 is a diagram in which the portion facing the connector 31 on an end face 11A of the board 11 is seen from a position opposite to the end face 11A in the direction of arrow III in FIG. 2. FIG. 4 illustrates a cross-section of the board 11 as seen in the direction of arrows IV-IV in FIG. 3.

In FIG. 2, the board 11 is, for example, a multilayer board of three layers. Specifically, the board 11 has a first dielectric layer 14, with a signal pattern 12 and a pair of ground patterns 13 formed on the top face of the first dielectric layer 14, a first ground layer 15 provided under the first dielectric layer 14, a second dielectric layer 16 provided under the first ground layer 15, and a second ground layer 17 provided under the second dielectric layer 16.

The first dielectric layer 14 and second dielectric layer 16 are formed from dielectric materials, such as, for example, glass epoxy, fluororesin, or ceramics. The signal pattern 12, ground patterns 13, first ground layer 15, and second ground layer 17 are formed from conductors made of, for example, copper and the like.

A signal transmission circuit that transmits radio-frequency signals of the microwave or millimeter wave band is formed on the board 11. Specifically, a transmission circuit of the co-planar waveguide type and micro strip line type with two ground layers is formed from the signal pattern 12, ground patterns 13, first ground layer 15, and second ground layer 17. The ground patterns 13, first ground layer 15, and second ground layer 17 operate as reference layers.

The signal pattern 12 and ground patterns 13 are located on the top face of the board 11 as well as on the first dielectric layer 14. The signal pattern 12 extends front-to-back in a linear configuration, with one end portion of the signal pattern 12 located on the board 11 on the end portion on the side where the connector 31 is secured. One ground pattern 13 is formed across a broad range at a location that is on the left of the signal pattern 12 and remote from the signal pattern 12. The other ground pattern 13 is formed across a broad range at a location that is on the right of the signal pattern 12 and remote from the signal pattern 12.

As shown in FIG. 4, the first ground layer 15 is provided under the first dielectric layer 14 and adjacent the first dielectric layer 14 so as to cover the entire bottom face of the first dielectric layer 14. The second dielectric layer 16 is provided under the first ground layer 15 and adjacent the first ground layer 15 so as to cover the entire bottom face of the first ground layer 15. The second ground layer 17 is provided under the second dielectric layer 16 and adjacent the second dielectric layer so as to cover the entire bottom face of the second dielectric layer 16.

In addition, multiple through-holes 18, which electrically interconnect the ground patterns 13, first ground layer 15, and second ground layer 17, are formed in the board 11. The through-holes 18 are disposed along the signal pattern 12 at locations proximal the signal pattern 12.

In addition, the width of the signal pattern 12, as well as the thickness of the signal pattern 12, ground patterns 13, and the respective layers, is set such that the characteristic impedance of the board 11 (signal transmission circuit) matches the characteristic impedance, etc., of the connector 31. The width of the signal pattern 12 is, for example, approximately 360 µm. In addition, the respective thicknesses of the signal pattern 12 and ground patterns 13 are approximately 34 µm, the thickness of the first dielectric layer 14 is approximately 200 µm, and the thickness of the first ground layer 15 is approximately 18 µm. In addition, the thickness of the second dielectric layer 16 is approximately 200 µm and the thickness of the second ground layer 17 is approximately 18 µm.

In addition, an adjustment aperture 19 used to adjust the characteristic impedance of the board 11 is formed in the first ground layer 15 in the portion located under one end of the signal pattern 12. It should be noted that the adjustment aperture 19 is not required and may be formed on an as-needed basis.

In addition, as shown in FIG. 2, a plating film 21, which serves as a conductive end-face film, is formed in a predetermined area on the end face 11A of the end portion of the board 11 on the side where the connector 31 is secured. The plating film 21 is formed by partially plating the board 11. For example, the plating film 21 is formed by plating the entire end face 11A of the board 11 and then peeling off or removing, via dissolution, the plating of the portion of the end face 11A located in close proximity to the signal pattern 12 under the signal pattern 12.

Specifically, the plating film 21 is formed: (1) on the end face 11A of the board 11, in an area that is on the left of the signal pattern 12 and extends from the end face of the left-hand ground pattern 13 to the end face of the second ground layer 17; (2) on the end face 11A of the board 11, in an area that is on the right of the signal pattern 12 and extends from the end face of the right-hand ground pattern 13 to the end face of the second ground layer 17; and (3) on the end face 11A of the board 11, in an area that is directly under the signal pattern 12, as seen from a position opposite to said end face 11A, and that extends from the end face of the first ground layer 15 to the end face of the second ground layer 17.

As shown in FIG. 3, the plating film 21 covers all the areas on the end face 11A of the board 11 except for the portion located in close proximity to the signal pattern 12 under the signal pattern 12. In addition, on the end face 11A of the board 11, the plating film 21 is respectively joined to the end faces of the ground patterns 13, the end face of the first ground layer 15, and the end face of the second ground layer 17. Accordingly, the ground patterns 13, first ground layer 15, and second ground layer 17 are electrically connected through the medium of the plating film 21. In addition, the thickness of the plating film 21 is, for example, approximately 43 µm.

To addition, as shown in FIG. 2, a pair of receiving holes 23, which serve as first bore portions used for securing the two securing portions 45 of the connector 31 with screws 49, are formed in the board 11. The two receiving holes 23 are disposed on the board 11 at the end where the connector 31 is secured, respectively on the left and right of the signal pattern 12. In addition, the receiving holes 23 pass through the board 11 in the vertical direction and open through the top face of the ground patterns 13.

Figure 5:
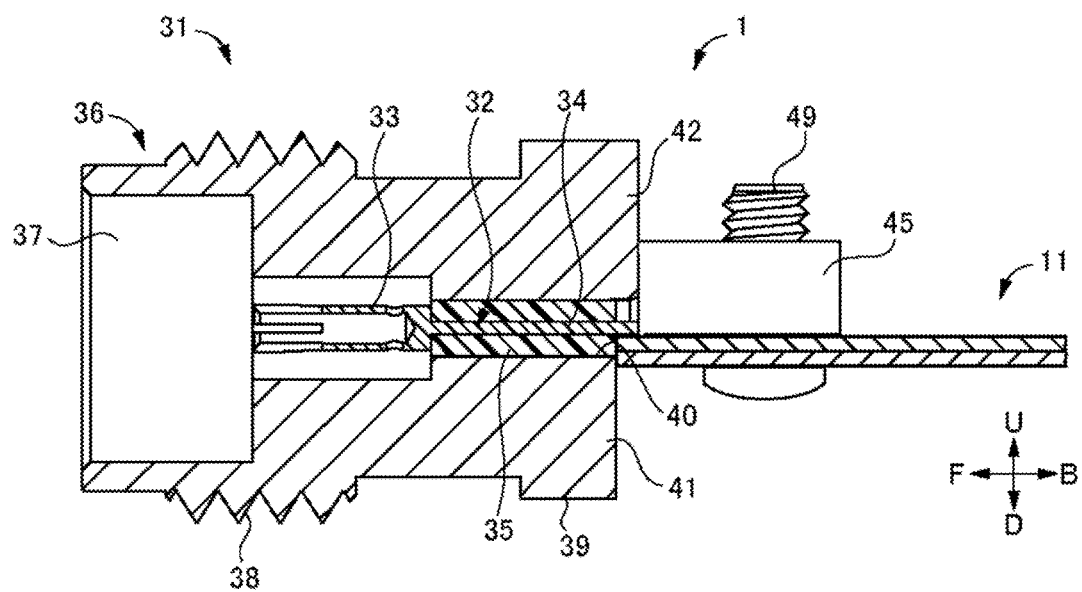
FIG. 5 illustrates a cross-sectional view illustrating the board and the connector as seen in the direction of arrows V-V in FIG. 1.
Figure 6:
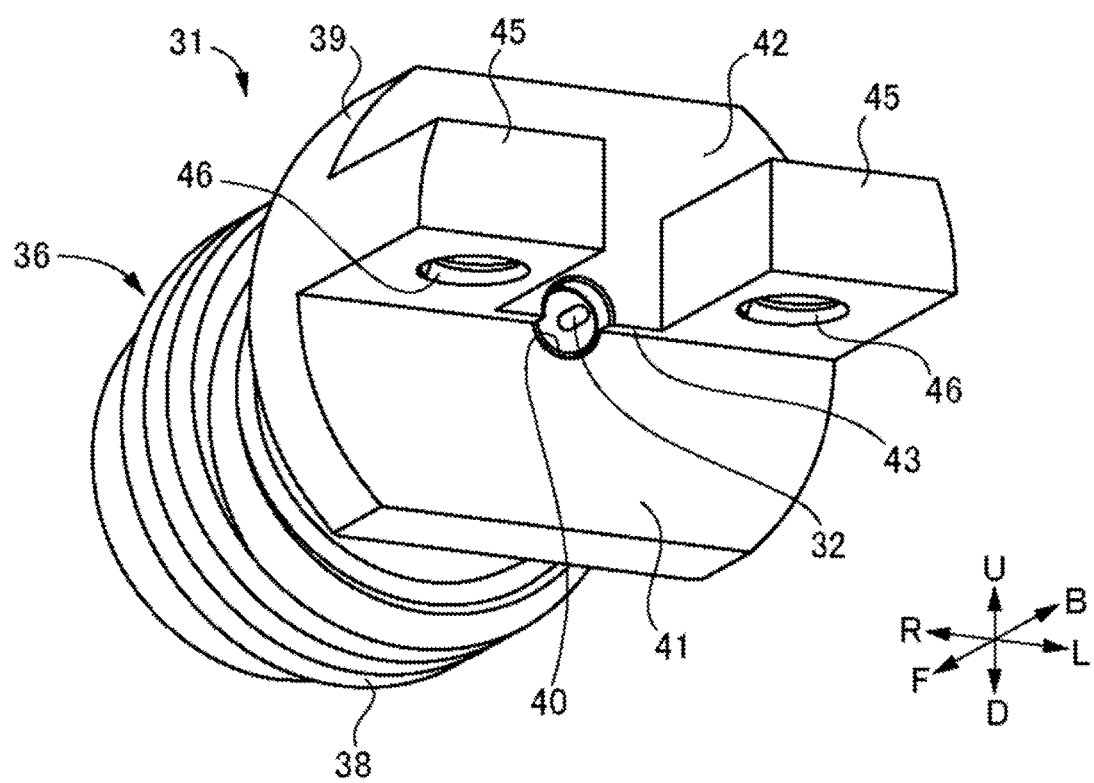
FIG. 6 illustrates an external view illustrating the end portion of the connector on the side where the board is secured in the structure for connecting a board and a connector according to the first embodiment of the present invention.
Figure 7:
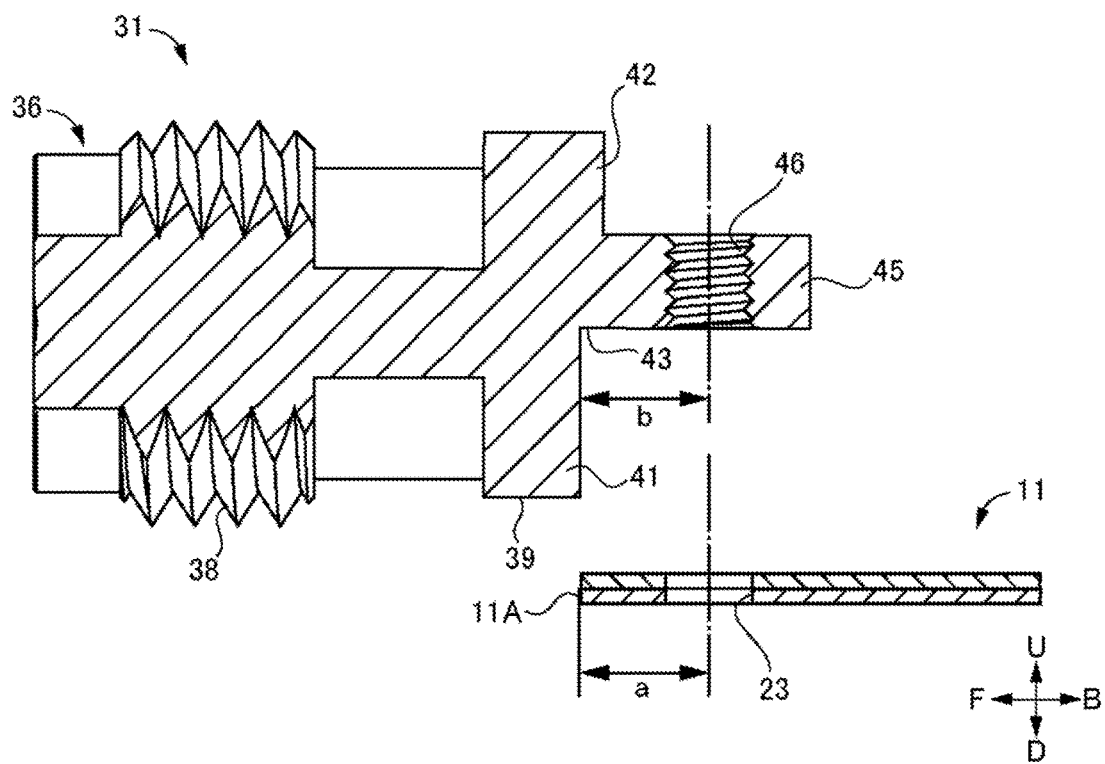
FIG. 7 illustrates a cross-sectional view illustrating the connector as seen in the direction of arrows VII-VII in FIG. 1 and the board as seen in the same direction.

FIG. 5 illustrates a cross-section of the connector 31 and the board 11, as seen in the direction of arrows V-V in FIG. 1. FIG. 6 illustrates the end portion of the connector 31 on the side where the board 11 is secured. FIG. 7 illustrates a cross-section of the connector 31 as seen in the direction of arrows VII-VII in FIG. 1, as well as a cross-section of the board 11 as seen in the same direction.

The connector 31 in FIG. 5 is a coaxial connector of the end launch type (edge mount type), namely, a coaxial connector of the type mounted to an end portion of a board such that a mating portion extends outwardly from the end portion of the board in a direction substantially parallel to the surface of the board. The connector 31 has a center conductor 32, an outer conductor 36 provided on the exterior periphery of the center conductor 32, with an insulator 35 interposed therebetween, and a pair of securing portions 45 for securing the connector 31 to an end portion of the board 11. The center conductor 32, outer conductor 36, and securing portions 45 are formed from conductors made of, for example, copper and the like. In addition, the shape, etc., of the center conductor 32 and outer conductor 36 is configured such that the characteristic impedance of the connector 31 is set to a predetermined level.

A connection terminal portion 33, which is connected to a center conductor in a counterpart connector, is formed in the front end portion of the center conductor 32. The connection terminal portion 33 of the present embodiment is, for example, of the female type, formed into a tubular shape. On the other hand, a contact terminal portion 34, which is in contact with the signal pattern 12, is formed in the rear end portion of the center conductor 32. The contact terminal portion 34 is formed in a pin-shaped configuration. In addition, in the contact terminal portion 34, the front portion is surrounded by an insulator 35 or air. In addition, the rear end portion of the contact terminal portion 34 exits the insulator 35 and protrudes in the rearward direction. In addition, the center conductor 32 is supported on, and secured to, the outer conductor 36 by the insulator 35.

A mating portion 37, into which a counterpart connector is inserted or fitted and which is connected to the outer conductor of the counterpart connector, is formed on the interior periphery of the front end portion of the outer conductor 36. In addition, a thread 38, which is used to secure the counterpart connector to the connector 31, is formed on the exterior periphery of the front end portion of the outer conductor 36. Meanwhile, as shown in FIG. 6, a flange 39, whose outside diameter is increased in comparison with other portions of the outer conductor 36, is formed on the rear end portion of the outer conductor 36.

In addition, as shown in FIG. 5, the radius of the aperture portion 40 in the rear end portion of the outer conductor 36 is smaller than the radius of the aperture portion (mating portion 37) in the front end portion of the outer conductor 36 and is also smaller than the radius of the interior space (i.e., the middle portion of the outer conductor 36), which receives the connection terminal portion 33 of the center conductor 32.

In addition, as shown in FIG. 6, on the rear end portion of the outer conductor 36 that faces the board 11, the lower end portion 41 located radially below is set back in the axial direction in comparison with the upper end portion 42 located radially above. Furthermore, a stepped surface 43, which connects the lower end portion 41 and the upper end portion 42, is formed between the lower end portion 41 and the upper end portion 42.

A pair of securing portions 45 are provided on the left and right of the aperture portion 40 on the end face of the upper end portion 42 of the outer conductor 36. The securing portions 45 protrude from the end face of the upper end portion 42 in the rearward direction. In addition, receiving holes 46, which serve as second bore portions used to secure the securing portions 45 to the board 11 with the screws 49, are formed in said securing portions 45. In the present embodiment, the receiving holes 46 pass through the securing portions 45 in the vertical direction and a thread is formed on the inner surface of the receiving holes 46.

Here, as shown in FIG. 7, the distance "a" from the end face 11A of the board 11 to the center of the receiving holes 23 formed in the board 11 is slightly longer than the distance "b" from the portion that the end face 11A of the board 11 opposes on the end face of the outer conductor 36 (i.e., the end face of the lower end portion 41) to the center of the receiving holes 46 formed in the securing portions 45.

Figure 8:
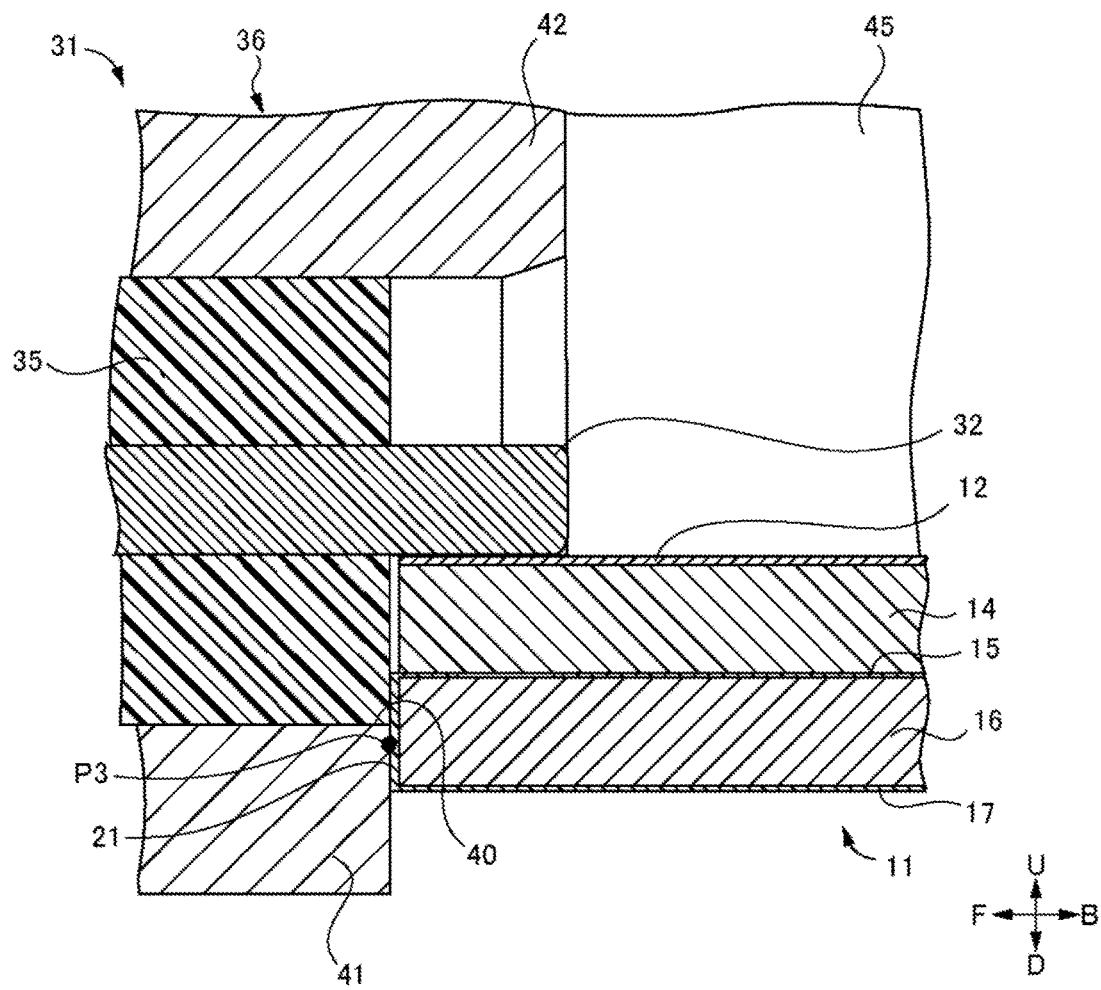
FIG. 8 illustrates an enlarged cross-sectional view illustrating the locations where the signal pattern of the board comes in contact with the center conductor of the connector and also where the plating film of the board comes in contact with the outer conductor of the connector in the structure for connecting a board and a connector according to the first embodiment of the present invention.

FIG. 8 shows an enlarged view of the locations where, in the board-connector connection structure 1 of FIG. 5, the signal pattern 12 of the board 11 comes in contact with the center conductor 32 of the connector 31 and also where the plating film 21 of the board 11 comes in contact with the outer conductor 36 of the connector 31.

When the board 11 and the connector 31 are connected, the securing portions 45 of the connector 31 are placed on the top face of the end portion of the board 11 and the positions of the respective receiving holes 46 of the two securing portions 45 and the two receiving holes 23 of the board 11 are aligned. Then, the screws 49, which serve as fastening members, are inserted from under the board 11 into the receiving holes 23 of the board 11. Said screws 49 are threaded into the receiving holes 46 of the securing portions 45 and tightened. As a result, the connector 31 is secured to the end portion of the board 11. In other words, the connector 31 is mounted to the board 11 such that the mating portion 37 extends outwardly from the end portion of the board 11 in a direction substantially parallel to the top face of the board 11.

As shown in FIG. 1 or FIG. 5, with the connector 31 secured in this manner to the end portion of the board 11, the bottom faces of the securing portions 45 of the connector 31 come in contact with the top face of the board 11, in other words, with the top face of the ground patterns 13. In addition, as shown in FIG. 8, the center conductor 32 of the connector 31 comes in contact with the signal pattern 12 of the board 11 and also the plating film 21 of the board 11 comes in contact with the end face of the lower end portion 41 of the outer conductor 36. In addition, the top face of the end portion of the board 11, that is, the top face of the end portion of the ground patterns 13, comes in contact with the stepped surface 43 formed between the upper end portion 42 and the lower end portion 41 of the outer conductor 36.

Here, in FIG. 3, where the end face 11A of the board 11 is seen from a position opposite to said end face 11A, the respective positions of the center conductor 32, the aperture portion 40 of the outer conductor 36, and the stepped surface 43 of the outer conductor 36 obtained when the connector 31 is secured to the end portion of the board 11 are shown superimposed on each other. As shown in FIG. 3, with the connector 31 secured to the end portion of the board 11, the range in which the plating film 21 formed on the end face 11A of the board 11 is in contact with the outer conductor 36 is the range outside the aperture portion 40 and also under the stepped surface 43. A portion of the plating film 21 formed on the end face 11A of the board 11, in an area that is on the left of the signal pattern 12 and extends from the end face of the left-hand ground pattern 13 to the end face of the second ground layer 17, for example, portion P1, is included in this range. In addition, a portion of the plating film 21 formed on the end face 11A of the board 11, in an area that is on the right of the signal pattern 12 and extends from the end face of the right-hand ground pattern 13 to the end face of the second ground layer 17, for example, portion P2, is included in the above-mentioned range where the plating film 21 is in contact with the outer conductor 36. Furthermore, a portion of the plating film 21 formed in an area that is directly under the signal pattern 12 and extends from the end face of the first ground layer 15 to the end face of the second ground layer 17, for example, portion P3, is included in the above-mentioned range where the plating film 21 is in contact with the outer conductor 36. As can be seen from FIG. 3, both portion P1 and portion P2 are remote from portion P0 located on the first ground layer 15 directly under the signal pattern 12. By contrast, portion P3 is extremely close to portion P0. Therefore, since portion P3 of the plating film 21 is in contact with the outer conductor 36, the first ground layer 15 and the outer conductor 36 are connected at a very short distance in a position directly under the signal pattern 12.

On the other hand, when the connector 31 secured to the board 11 is separated from the board 11, it is sufficient to unscrew and remove the screws 49.

As described above, in accordance with the board-connector connection structure 1 of the first embodiment of the present invention, the first ground layer 15 and the outer conductor 36 can be connected at a very short distance directly under the signal pattern 12 by using a configuration in which the plating film 21 is formed on the end face 11A of the board in an area that is located directly under the signal pattern 12 and includes an end face of the first ground layer 15. Therefore, the characteristics of signal reflection between the board 11 and the connector 31 can be enhanced.

Figure 9:
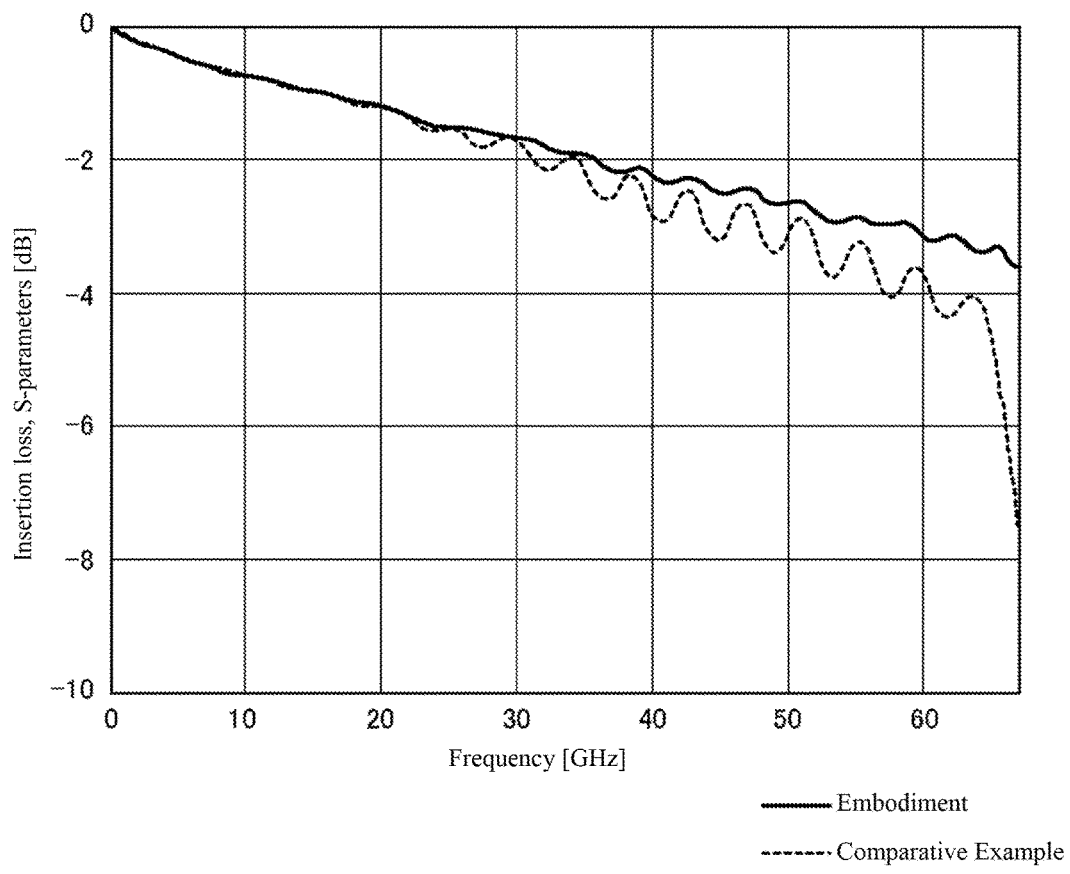
FIG. 9 illustrates a graph illustrating the respective insertion losses of the structure for connecting a board and a connector according to the first embodiment of the present invention and a structure for connecting a board and a connector according to a comparative example.
Figure 14:
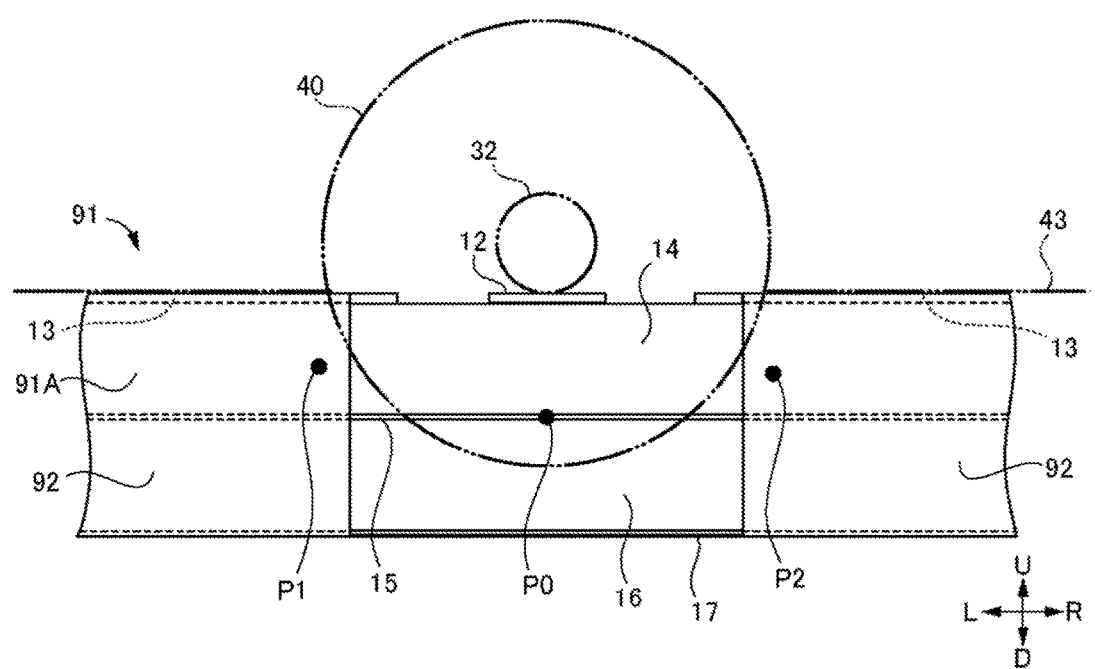
FIG. 14 illustrates an external view illustrating an end face of an end portion of a board to which a connector is secured in a structure for connecting a board and a connector according to a comparative example.

Here, the graph of FIG. 9 respectively illustrates insertion losses of the board-connector connection structure 1 of the first embodiment of the present invention (solid line) and insertion losses of a board-connector connection structure used in a comparative example (dashed line). The board-connector connection structure of the comparative example connects the connector 31 of the board-connector connection structure 1 and the board 91 illustrated in FIG. 14. As shown in FIG. 14, in the board 91 of the board-connector connection structure of the comparative example, the signal pattern 12, ground patterns 13, first dielectric layer 14, first ground layer 15, second dielectric layer 16, and second ground layer 17 are identical to the corresponding elements of the board 11 of the board-connector connection structure 1 used in the first embodiment of the present invention. In addition, in the board 91 of the board-connector connection structure of the comparative example, the plating film 92 is formed: (1) on the end face 91A of the board 91, in the area that is on the left of the signal pattern 12 and extends from the end face of the left-hand ground pattern 13 to the end face of the second ground layer 17, and (2) on the end face 91A of the board 91, in the area that is on the right of the signal pattern 12 and extends from the end face of the right-hand ground pattern 13 to the end face of the second ground layer 17. However, no plating film is formed on the end face 91A of the board 91 in the area that is located directly under the signal pattern 12, as seen from a position opposite to said end face 91A, and that extends from the end face of the first ground layer 15 to the end face of the second ground layer 17. Therefore, as shown in FIG. 14, when the connector 31 is secured to the end portion of the board 91, portions P1 and P2 of the plating film 92 come in contact with the outer conductor 36, thereby causing the first ground layer 15 to be connected to the outer conductor 36. However, these connection portions are both remote from portion P0, which is located on the first ground layer 15 directly under the signal pattern 12.

As can be seen from FIG. 9, as concerns the frequency of the signals flowing through the board-connector connection structure, which is generally in the range of from 25 GHz to 65 GHz, the insertion loss of the board-connector connection structure 1 of the first embodiment of the present invention is smaller than that of the board-connector connection structure of the comparative example and, in addition, the degree of increase in insertion loss that occurs as frequency increases is also smaller for the board-connector connection structure 1 of the first embodiment of the present invention than for the board-connector connection structure of the comparative example. Furthermore, while the insertion loss of the board-connector connection structure of the comparative example abruptly increases when the frequency of the signal is just over 65 GHz, the degree of increase in insertion loss of the board-connector connection structure 1 of the first embodiment of the present invention continues to increase gradually in a manner similar to lower frequency bands even when the frequency of the signal exceeds 65 GHz. Thus, the board-connector connection structure 1 of the first embodiment of the present invention has superior reflection characteristics in comparison with the board-connector connection structure of the comparative example.

In addition, in the board-connector connection structure 1 of the first embodiment of the present invention, no solder, silver paste, or electroconductive adhesive is required to connect the first ground layer 15 and the outer conductor 36 because the first ground layer 15 and the outer conductor 36 are connected by bringing the plating film 21 into contact with the outer conductor 36. Therefore, the connection and separation of the connector 31 to and from the board 11 can be accomplished with ease because the operations of soldering and the like become unnecessary when the board 11 and the connector 31 are connected and, on the other hand, the operations of unsoldering and the like become unnecessary when the connector 31 is separated from the board 11. If the board-connector connection structure 1 is applied, for example, to a test board and the like, then the tests and measurements utilizing said test board and the like can be accomplished in a simple manner.

In addition, in accordance with the board-connector connection structure 1 of the first embodiment of the present invention, even if the board 11 is a multilayer board that has one or more layers under the first ground layer 15, as shown in FIG. 2, the first ground layer 15 and the outer conductor 36 can be connected at a very short distance in a position directly under the signal pattern 12. Namely, in the conventional multilayer wiring board described in the above-mentioned Patent Document 1, a configuration is implemented in which a ground layer forming part of a signal transmission circuit and an outer conductor are joined using solder and the like at a location that is directly under a radio-frequency signal path formed on the top face of a dielectric layer by adopting a complicated board structure in which the end portions of layers located under said ground layer are removed to expose a portion of the bottom face of said ground layer. However, in ordinary multilayer boards, the end faces of the layers are aligned. For this reason, when additional layers are present under the ground layer that forms part of a signal transmission circuit in conjunction with the signal pattern, the bottom face of said ground layer is not exposed. For this reason, solder and the like cannot be applied to a location where said ground layer opposes the outer conductor in a position directly under the signal pattern and, consequently, it is difficult to connect said ground layer and the outer conductor directly under the signal pattern. By contrast, in accordance with the board-connector connection structure 1 of the first embodiment of the present invention, even if the board 11 is a multilayer board that has one or more layers under the first ground layer 15 and the end faces of the layers are aligned, the first ground layer 15 and the outer conductor 36 can be connected in a position directly under the signal pattern 12 by bringing the plating film 21 formed on the end face 11A of the board 11 into contact with the outer conductor 36 of the connector 31.

In addition, in accordance with the board-connector connection structure 1 of the first embodiment of the present invention, the surface area of the plating film 21 can be increased by using a configuration in which the plating film 21 is termed on the end face 11A of the board 11 in an area that is directly under the signal pattern 12, as seen from a position opposite to said end face 11A, and that extends from the end face of the first ground layer 15 to the end face of the second ground layer 17. As a result, the area of contact between the plating film 21 and the outer conductor 36 can be increased. Therefore, the stability of grounding can be improved and the characteristics of signal reflection can be enhanced even more.

In addition, in accordance with the board-connector connection structure 1, a configuration can be readily implemented in which an electroconductive end-face film formed on the end face 11A of the board 11 is used as the plating film 21, thereby connecting the first ground layer 15 to the outer conductor 36 directly under the signal pattern 12. In addition, such a plating film 21 can be readily formed by partially plating the board 11. In addition, in accordance with the board-connector connection structure 1 of the first embodiment, the plating film 21 can be formed in a precise manner by plating using the first ground layer 15 and second ground layer 17 as electrodes.

In addition, in the board-connector connection structure 1, a configuration is used in which the lower end portion 41 of the outer conductor 36 of the connector 31 is set back relative to the upper end portion 42 and, when the connector 31 is secured to the end portion of the board 11, the end face 11A of the end portion of the board 11 opposes the end face of the lower end portion 41 and the top face of the end portion of the board 11 opposes the stepped surface 43 connecting the lower end portion 41 and the upper end portion 42. Accordingly, as shown in FIG. 8, the contact portion between the center conductor 32 and the signal pattern 12 can be disposed between the upper end portion 42 of the outer conductor 36 and the end portion of the first ground layer 15 of the board 11. Accordingly, a structure that suppresses signal reflection between the board 11 and the connector 31 can be readily formed. In addition, the board 11 and the connector 31 can be coupled by fitting the end portion of the board 11 into a corner portion formed by the stepped surface 43 and the end face of the lower end portion 41 of the outer conductor 36, such that the board 11 and the connector 31 can be secured in a stable manner.

In addition, in accordance with the board-connector connection structure 1, using a configuration in which the securing portions 45 of the connector 31 are secured with screws 49 to the board 11 makes it possible to secure the board 11 and the connector 31 in a removable manner, such that the connection and separation of the connector 31 to and from the board 11 is further facilitated. Alternatively, the board 11 and the connector 31 can be secured in a rigid manner using the screws 49.

In addition, as was previously described with reference to FIG. 7, in the board-connector connection structure 1, the distance "a" from the end face 11A of the board 11 to the center of the receiving holes 23 in the board 11 is slightly longer than the distance "b" from the end face of the lower end portion 41 of the outer conductor 36 to the center of the receiving holes 46 in the securing portions 45. Therefore, when the screws 49 are inserted into the receiving holes 23 in the board 11 and fastened into the receiving holes 46 of the securing portions 45, the plating film 21 formed on the end face 11A of the board 11 is pressed against the end face of the lower end portion 41 of the outer conductor 36. This can ensure reliable contact between the plating film 21 and the outer conductor 36.

Embodiment 2

Figure 10:
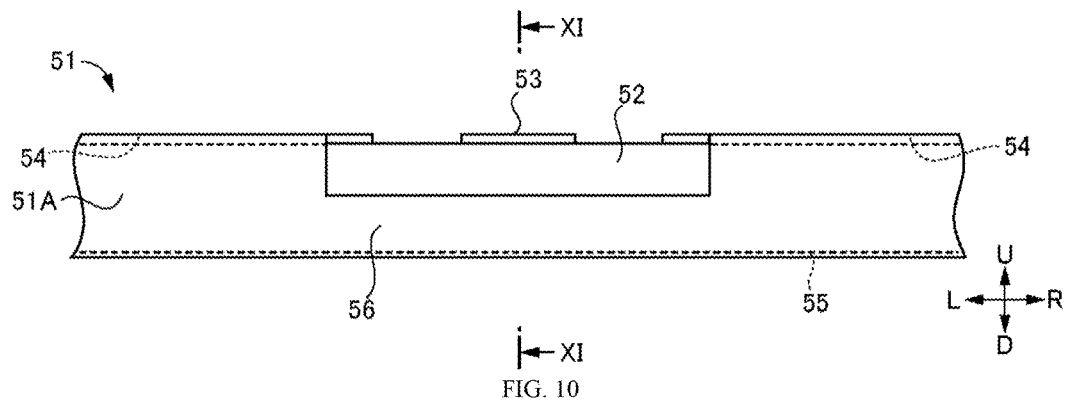
FIG. 10 illustrates an external view illustrating an end face of an end portion of a board to which a connector is secured in a structure for connecting a board and a connector according to a second embodiment of the present invention.
Figure 11:
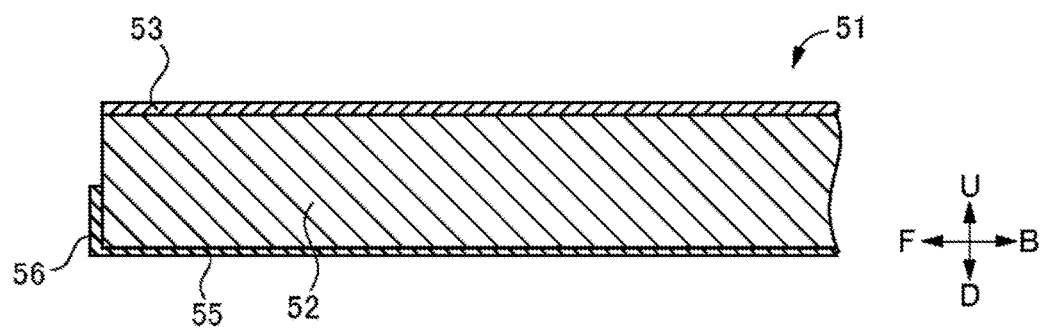
FIG. 11 illustrates a cross-sectional view illustrating the board as seen in the direction of arrows XI-XI in FIG. 10.

FIG. 10 is a diagram in which a board 51 used in a structure for connecting a board and a connector according to a second embodiment of the present invention is seen from the same position as in FIG. 3. FIG. 11 illustrates a cross-section of the board 51 as seen in the direction of arrows XI-XI in FIG. 10. As shown in FIG. 10 or FIG. 11, the board 51 has fewer layers in comparison with the board 11 of the first embodiment illustrated in FIG. 3 or FIG. 4. The board 51 has a dielectric layer 52, a signal pattern 53 formed on the top face of the dielectric layer 52, a pair of ground patterns 54 formed on the top face of the dielectric layer 52 on the left and right of the signal pattern 53, and a ground layer 55 provided under the dielectric layer 52 and adjacent the dielectric layer 52. No layers are formed under the ground layer 55.

In addition, on the board 51, a plating film 56 serving as a conductive end-face film is formed: (1) on the end face 51A of the board 51, in an area that is on the left of the signal pattern 53 and extends from the end face of the left-hand ground pattern 54 to the end face of the ground layer 55; (2) on the end face 51A of the board 51, in an area that is on the right of the signal pattern 53 and extends from the end face of the right-hand ground pattern 54 to the end face of the ground layer 55; and (3) on the end face 51A of the board 51, in an area that is located directly under the signal pattern 53, as seen from a position opposite to said end face 51A, and that is also remote from the signal pattern 53 and includes the end face of the ground layer 55. Specifically, the portion of the plating film 56 located directly under the signal pattern 53 is formed in an area that extends from a substantially intermediate vertical position on the dielectric layer 52 to the end face of the ground layer 55.

In the board-connector connection structure of the second embodiment of the present invention including the thus-configured board 51, the characteristics of signal reflection between the board 51 and the connector can be enhanced and the connection and separation of the connector to and from the board 51 can be accomplished with ease, in the same manner as in the board-connector connection structure 1 of the first embodiment of the present invention.

Figure 12:
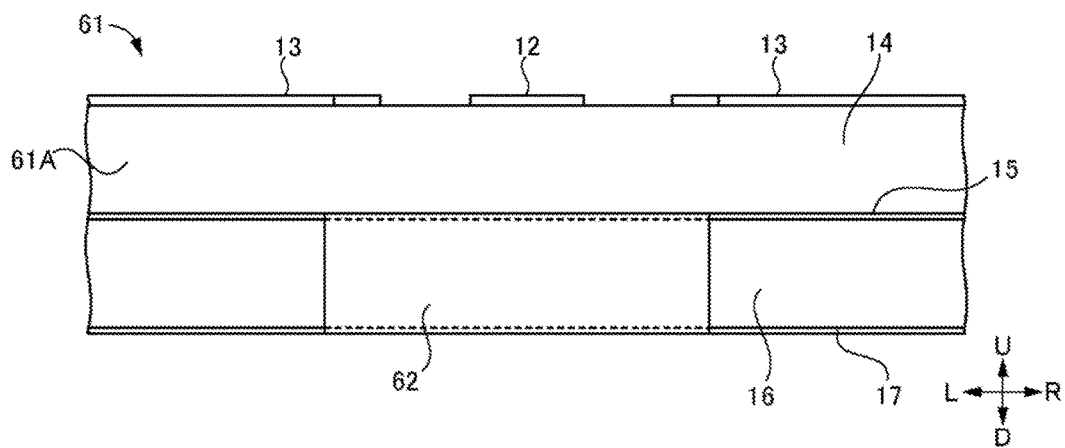
FIG. 12 illustrates an external view illustrating an end face of an end portion of a board to which a connector is secured in a structure for connecting a board and a connector according to another embodiment of the present invention.

It should be noted that the board 61 illustrated in FIG. 12 may be used instead of the board 11 of the first embodiment. While the board 61 has the same layer structure as the board 11, no plating film is formed on the left- and right-hand side on the end face 61A of the board 61. In other words, the plating film 62 is formed on the end face 61A of the board 61 only in the area that is located directly under the signal pattern 12, as seen from a position opposite to said end face 61A, and that extends from the end face of the first ground layer 15 to the end face of the second ground layer 17.

Figure 13:
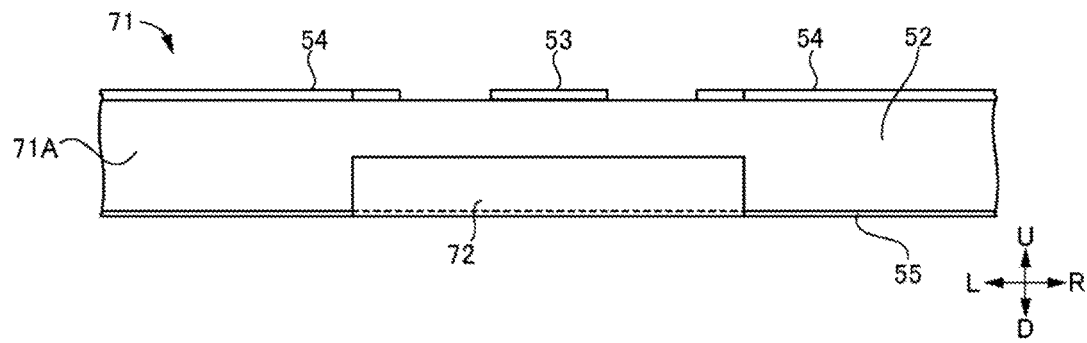
FIG. 13 illustrates an external view illustrating an end face of an end portion of a board to which a connector is secured in a structure for connecting a board and a connector according to yet another embodiment of the present invention.

In addition, the board 71 illustrated in FIG. 13 may be used instead of the board 51 of the above-described second embodiment. While it has the same layer structure as the board 51, no plating film is formed on the left- and right-hand side on the end face 71A of the board 71. In other words, the plating film 72 is formed on the end face 71A of the board 71 only in the area that is located directly under the signal pattern 53, as seen from a position opposite to said end face 71A, and that is remote from the signal pattern 53 and includes the end face of the ground layer 55.

In addition, as an alternative, no ground patterns 13 (54) are formed on the board 11 (51, 61, 71) and a microstrip line-type transmission circuit is formed on the board 11 (51, 61, 71).

In addition, the plating film 21 (56, 62, 72) may be formed using a method in which plated and unplated portions are formed by masking. In addition, the electroconductive end-face film may be formed not by plating, but by coating with a conductive material or by bonding.

In addition, the number of layers in the board of the inventive board-connector connection structure is not limited. For example, the board 11 used in the first embodiment may be configured as a multilayer board of four or more layers. In addition, a third dielectric layer may be provided under the first ground layer 17 of the board 11 used in the first embodiment and a dielectric layer may be provided under the ground layer 55 of the board 51 used in the second embodiment. In addition, control circuits, signal processing circuits, and the like may be formed in the board in layers located under the ground layer that forms part of the signal transmission circuit in conjunction with the signal pattern.

In addition, solder and the like may be used to connect the center conductor and the signal pattern. In addition, securing members other than screws may be used to secure the securing portions of the connector to the board. In addition, the present invention may be applied to transmission circuits used for signals with frequencies lower than microwave.

In addition, the present invention can be appropriately modified as long as the modifications do not contradict the gist or concept of the invention that can be read from its claims and Specification taken in its entirety, and structures for connecting a board and a connector, boards, and methods for connecting a board and a connector based on this type of modifications are also within the technical concept of the present invention.

DESCRIPTION OF THE REFERENCE NUMERALS

1 Board-connector connection structure (structure for connecting a board and a connector)
11, 51, 61, 71 Boards 11A, 51A, 61A, 71A End faces
12, 53 Signal patterns
14, 52 First dielectric layers
15 First ground layer
16 Second dielectric layer
17 Second ground layer
21, 56, 62, 72 Plating films (electroconductive end-face films)
23 Receiving holes (first bore portions)
31 Connector
32 Center conductor
35 Insulator
36 Outer conductor
41 Lower end portion
42 Upper end portion
43 Stepped surface
45 Securing portion
46 Receiving holes (second bore portions)
49 Screws (fastening members)
55 Ground layer

What is claimed is:

1. A structure comprising a board and a connector secured to an end portion of the board,
the board comprising:
a first dielectric layer,
a signal pattern that is provided on the top face of the first dielectric layer,
a first ground layer that is provided under the first dielectric layer and forms part of a signal transmission circuit in conjunction with the signal pattern, and
an electroconductive end-face film formed on an end face of the end portion of the board in an area that is located directly under the signal pattern, a seen from a position opposite to said end face, and that is remote from the signal pattern and includes an end face of the first ground layer,
the connector comprising:
a center conductor,
an outer conductor provided on the exterior periphery of the center conductor, with an insulator interposed therebetween, and
securing portions that are provided on the outer conductor and secure said connector to the end portion of the board; and
when the connector is seemed to the end portion of the board by the securing portions, the center conductor comes in contact with the signal pattern and the electroconductive end-face film comes in contact with the outer conductor.

2. The structure according to claim 1, wherein the board is a multilayer board further having one or more layers provided under the first ground layer.

3. The structure according to claim 2, wherein:
the board comprises:
a second dielectric layer provided under the first ground layer and adjacent said first ground layer and
a second ground layer provided under the second dielectric layer and adjacent said second dielectric layer, and
wherein the electroconductive end-face film is formed on an end face of the end portion of the board in an area that is directly under the signal pattern, as seen from a position opposite to said end face, and that extends from the end face of the first ground layer to the end face of the second ground layer.

4. The structure according to claim 1, wherein the electroconductive end-face film is a plating film formed by partially plating the board.

5. The structure according to claim 1, wherein on the end portion of the tubular-shaped outer conductor on the side facing the board, a lower end portion located radially below is set back in the axial direction relative to an upper end portion located radially above, a stepped surface connecting the lower end portion and the upper end portion is formed between the lower end portion and the upper end portion, and,
when the connector is secured to the end portion of the board by the securing portions, the end face of the end portion of the board opposes the end face of the lower end portion and the top face of the end portion of the board opposes the stepped surface.

6. The structure according to claim 1, wherein the securing portions protrude above the top face of the board from the end portion of the outer conductor on the side facing the board, and said securing portions are secured to the top face of the board via fastening members.

7. The structure according to claim 6, wherein first bore portions that accept the fastening members therethrough in order to secure the securing portions to the top face of the board are formed in said board, second bore portions that accept the fastening members therethrough in order to secure the securing portions to the top face of the board are formed in said securing portions, and the distance to the first bore portions from the end face of the end portion of the board is longer than the distance to the second bore portions from the portion that the end face of the end portion of the board opposes on the end face of the outer conductor.

8. A board that forms part of a signal transmission circuit, said board comprising:
a dielectric layer,
a signal pattern that is provided on the top face of the dielectric layer,
a ground layer that is provided under the dielectric layer and forms part of the signal transmission circuit in conjunction with the signal pattern, and
an electroconductive end-face film formed on an end face of the end portion of said board in an area that is located directly under the signal pattern, as seen from a position opposite to said end face, and that is remote from the signal pattern and includes the end face of the ground layer; and
when an edge mount type connector comprising a center conductor and an outer conductor provided on the exterior periphery of the center conductor, with an insulator interposed therebetween, is secured to the end portion of said board, the center conductor comes in contact with the signal pattern and the electroconductive end-face film comes in contact with the outer conductor.

9. A method, comprising:
connecting a board comprising a dielectric layer, a signal pattern that is provided on the top face of the dielectric layer, and a ground layer that is provided under the dielectric layer and forms part of a signal transmission circuit in conjunction with the signal pattern, with a connector comprising a center conductor, an outer conductor provided on the exterior periphery of the center conductor, with an insulator interposed therebetween, and securing portions that are provided on the outer conductor and secure said connector to the end portion of the board, forming an electroconductive end-face film an end face of the end portion of the board in an area that is located directly under the signal pattern, as seen from a position opposite to said end face, and that is remote from the signal pattern and includes the end face of the ground layer, and securing the connector to the end portion of the board via the securing portions while bringing the center conductor into contact with the signal pattern and while also bringing the electroconductive end-face film into contact with the outer conductor.

10. The method according to claim 9, wherein the forming of the electroconductive end-face film is accomplished by partially plating the board.

* * * * *

UNITED STATES PATENT AND TRADEMARK OFFICE
CERTIFICATE OF CORRECTION

PATENT NO. : 10,148,027 B2
APPLICATION NO. : 15/812765
DATED : December 4, 2018
INVENTOR(S) : Teppei Matsumoto Page 1 of 1

It is certified that error appears in the above-identified patent and that said Letters Patent is hereby corrected as shown below:

On the Title Page

Item (30), should read:
Foreign Application Priority Data
Nov. 14, 2016 (JP)............ 2016-221169

Signed and Sealed this
Second Day of July, 2019

Andrei Iancu
*Director of the United States Patent and Trademark Office*